United States Patent [19]

Ivanov et al.

[11] Patent Number: 5,698,261
[45] Date of Patent: Dec. 16, 1997

US005698261A

[54] PROCESS FOR PRODUCING SILICON CARBIDE LAYERS AND AN ARTICLE

[75] Inventors: Leonard Stepanovich Ivanov, Dokuchaev pereulok, 17, kv. 62, Moscow; Georgy Evgenievich Chernikov, Komsomolsky bulvar, 4, kv. 44, Tjumenskaya oblast, Nizhnevartovsk; Alexandr Vyacheslavovich Eljutin, Moscow, all of Russian Federation

[73] Assignees: Aktsionernoe Obschestvo Russkoe Obschestvo Prikladnoi Elektroniki; Vladimir Vasilievich Mitin, both of Moscow; Georgy Evgenievich Chernikov, Nizhnevartovsk; Leonard Stepanovich Ivanov, Moskow, all of Russian Federation

[21] Appl. No.: 416,821

[22] PCT Filed: Aug. 15, 1994

[86] PCT No.: PCT/RU94/00201

§ 371 Date: Jul. 13, 1995

§ 102(e) Date: Jul. 13, 1995

[87] PCT Pub. No.: WO95/05495

PCT Pub. Date: Feb. 23, 1995

[30] Foreign Application Priority Data

Aug. 17, 1993 [RU] Russian Federation ............. 93041257
Aug. 17, 1993 [RU] Russian Federation ............. 93041348

[51] Int. Cl.[6] .................................................. C23C 16/32
[52] U.S. Cl. .................. 427/249; 427/255.1; 427/255.7; 427/345

[58] Field of Search .................. 427/99, 249, 255.1, 427/255.7, 345; 118/603; 428/901, 698, 408; 501/88, 90, 95

[56] References Cited

U.S. PATENT DOCUMENTS

| | | | |
|---|---|---|---|
| 3,091,517 | 5/1963 | Short et al. | 23/210 |
| 4,131,697 | 12/1978 | Randon et al. | 427/249 |
| 4,491,604 | 1/1985 | Lesk et al. | 427/8 |
| 4,980,202 | 12/1990 | Brennan et al. | 427/249 |
| 4,997,678 | 3/1991 | Taylor et al. | 427/249 |
| 5,118,485 | 6/1992 | Arvidson et al. | 423/342 |
| 5,154,862 | 10/1992 | Reagan et al. | 264/60 |
| 5,462,800 | 10/1995 | Yamazaki et al. | 428/408 |

FOREIGN PATENT DOCUMENTS

| | | |
|---|---|---|
| 327779 | 6/1973 | U.S.S.R. . |
| 1791380 | 1/1993 | U.S.S.R. . |
| 1100407 | 1/1968 | United Kingdom . |
| 1257519 | 12/1971 | United Kingdom . |

*Primary Examiner*—Shrive Beck
*Assistant Examiner*—Timothy Meeks
*Attorney, Agent, or Firm*—Ostrolenk, Faber, Gerb & Soffen, LLP

[57] ABSTRACT

A process for depositing silicon carbide layers to produce highly pure silicon carbide having a stoichiometric composition and a theoretical density includes feeding a gas mixture to a heated substrate under specified conditions, separating the decomposition products into gas and liquid phases by condensation, rectifying the liquid phase and recycling recovered materials, cooling the gas phase and recovering a solid deposit, and compressing and recycling hydrogen.

6 Claims, No Drawings

PROCESS FOR PRODUCING SILICON CARBIDE LAYERS AND AN ARTICLE

BACKGROUND OF THE INVENTION

The invention relates to chemical engineering, more particularly to a process for depositing silicon carbide layers from a gas phase and also to an article manufactured by this process. The use of this process in microelectronics makes it possible to substantially improve the quality of superlarge integrated circuits having a memory capacity of greater than 1 mbit.

Known in the art is a process for producing silicon carbide layers by deposition from a gas phase containing methyl trichlorosilane and hydrogen. The deposition process is carried out on a tungsten substrate at a temperature of 1200° to 1500° C. at a pressure of 10 to 700 mm Hg and a hydrogen flow rate of 500 cm/min (see British Patent 1031833, Class C23C 11/00, 1964).

This process is disadvantageous in that it cannot produce nonporous silicon carbide having a dense structure, has low deposition rate, high energy consumption and it causes the contamination of the environment by reaction products.

Also known is a process for producing silicon carbide layers by deposition from the gas phase. The process comprises precleaning the original components such as methyl trichlorosilane and hydrogen, mixing them at a methyl trichlorosilane to hydrogen concentration of 0.5 to 1.5 g/l (the molar ratio is 1:13.5–4.5), feeding the mixture into a reactor at a gas stream volumetric rate of 6 to 10 l/hr (the feed density is 0.13–0.22 g/cm$^2$.hr), thermal decomposition on a graphite filament heated to 1400°–1500° C. to produce silicon carbide layers (see L. P. Ivanova et al, "Preparation of Polycrystalline Silicon Carbide by Thermal Decomposition of Methyl Trichlorosilane", "Silicon Carbide", Kiev, Naukovo Dumka Publishers, 1966, p.151).

The process is disadvantageous in that it has high specific capacity and low efficiency and this makes it impossible to use it on an industrial scale. The process also provides no measures to make it ecologically pure, as the decomposition products (such as hydrogen chloride, hydrogen, organochlorosilanes, silicon chlorides) which cause contamination of the environment cannot be utilized.

Known in the art is a process for manufacturing silicon carbide articles by mixing liquid carbon compounds (liquid hydrocarbons) and liquid silicon compounds (organochlorosilanes) and depositing silicon carbide on a carbanaceous mandrel at a temperature higher than 1000° C. The mixing of the original components, vapor pressure and the composition of the gas-vapor mixture (GVM) than these components are fed into the reactor and are regulated so that the molar fraction of the silicon compound in vapors exceeds the molar traction of the carbon compound (see Japanese Patent Application No. 56-5686, class C01 B 31/36, 1981).

The article and the process are disadvantageous in that the articles having the stoichiometric composition without inclusion of second phases and high density without internal mechanical stresses cannot be produced.

Known in the art are a process and an article produced from silicon carbide by deposition from the gas phase. The process comprises feeding a gas-vapor mixture of alkyl chlorosilane and hydrogen into a reactor at a molar ratio of 1:(1–3), respectively, depositing silicon carbide onto a mandrel heated to 1200°–1250° C. and removing the mandrel (see British Patent No. 1100407, class C01 B 31/36, 1965).

The process and the resulting articles are disadvantageous in that it is impracticable to produce nonporous articles having theoretical density of the stoichiometric composition which contains no second phases. Besides, the process does not envisage measures aimed at protecting the environment from outgoing gases, and the yield of alkylchlorosilane into silicon carbide does not exceed 30%.

DESCRIPTION OF THE INVENTION

The object of the invention is basically to provide a process for producing silicon carbide layers that enable one to produce silicon carbide which has a stoichiometric composition, contains no second phases, has high density (the density value corresponds to the theoretical value), high purity (the impurity content is not greater than $1.10^{-4}$–$1.10^{-5}$ wt. %), as the process efficiency increases, the energy consumption becomes lower, the process is ecologically pure and wasteless.

The object of the invention is also to produce articles from silicon carbide layers based on the claimed process, said article having theoretical density of the stoichiometric composition containing no second phases, having fine-grain structure and improved strength.

This object can be achieved by providing the claimed process for producing silicon carbide layers, which comprises cleaning for original components, feeding a gas-vapor mixture (GVM) of methyl chlorosilane and hydrogen into a reactor and decomposing it on a heated substrate to form decomposition products,

- feeding the mixture at a density of 3–4 g/cm$^2$.hr and a methyl trichlorosilane to hydrogen molar ratio of 1:(1–3) to a substrate heated to 1200°–1250° C.;
- withdrawing the products from the reactor separating them into gaseous and liquid phases by condensation from 0° to −120° C.;
- directing the liquid phase by gravity to be rectified;
- separating methyl trichlorosilane and other organochlorosilanes and recycling them to the reactor;
- cooling the gas phase containing hydrogen chloride, methane and hydrogen to −185° to 196° C. and separating hydrogen chloride and methane as a solid deposit;
- compressing hydrogen and recycling it to the reactor.

The essence of the process is as follows.

The original components such as methyl trichlorosilane (MTCS) and hydrogen (H$_2$) are subjected to fine cleaning. Methyl trichlorosilane (MTCS) is cleaned by rectification with the removal of the middle fraction, the light fraction and the stillage residue are withdrawn from the process.

Hydrogen is cleaned by a sorption method and on a palladium filter. The cleaned MTCS and H$_2$ are mixed in a bubbler evaporator at a H$_2$ to MTCS molar ratio of 1–3:1 and the mixture vapors are fed to the reactor at a density of 3–4 m/cm$^2$.hr calculated for MTCS. The molar ratio of the original components and the high MTCS feed density cause preparation of small grain-size nonporous deposits having the stoichiometric composition and theoretical density. The substrate temperature should be maintained at 1200°–1250° C. Such a combination of features provides high quality of the resulting silicon carbide, high process efficiency at a deposition rate of not greater than 1 mm/hr and lower specific electric energy consumption per unit of the final product. The claimed process is highly ecological and wasteless. This is due to the fact that after silicon carbide is cooled, the effluent gas-vapor mixture is directed to be condensed. The condensation may be effected at a temperature ranging from 0° to −75° C. Unreacted MTCS, other organochlorosilanes (dimethyl chlorosilane or the like) and chlorosilanes ($SiCl_4$, $SiHCl_3$) become condensed within this temperature range, and hydrogen chloride, methane, hydrogen and residual amounts of uncondensed chlorosilanes, dichlorosilane and MTCS traces remain in the gas phase. The condensate is continuously directed by gravity to recover methyl trichlorosilane and other organochlorosilanes by rectification. Methyl trichlorosilane and dimethyl dichlorosilane are recycled to the silicon carbide production process. In this case, the total recovery of silicon carbide is increased by 1.3–1.5 times. The gas phase containing hydrogen chloride, hydrogen and methane are burned and the resulting heat is used. To make the process ecologically more effective, the gas-vapor mixture (GVM) flowing out of the reactor is subjected to complete condensation. The complete condensation is effected within the temperature range of from 0° C. to −120° C. (e.g. stepwise) to obtain MTCS and other organochlorosilanes (dimethyl dichlorosilane or the like), silicon tetrachloride, trichlorosilane and other chlorosilanes in individual fractions. Each fraction is being continuously withdrawn from the condensation process and then directed to be rectified. The cleaned MTCS and dimethyl dichlorosilane (DMDCS) are combined and recycled to the process for the deposition of silicon carbide. The amount of DMDCS produced is much smaller than that of MTCS and this amount can therefore be neglected when calculating the MTCS to hydrogen molar ratio and the GVM feed density in the process for the deposition of silicon carbide. Chlorosilanes such as silicon tetrachloride ($SiCl_4$) and trichlorosilane ($SiHCl_3$) produced in the condensation process and cleaned by rectification are commercial high-grade products. After complete condensation of organochlorosilanes and chlorosilanes, the gas phase containing hydrogen chloride (HCl), hydrogen ($H_2$), methane ($CH_4$) is cooled to a temperature ranging from −185° to −196° C. HCl and $CH_4$ become frozen within the temperature range indicated above, and the hydrogen that remains in the gas phase is compressed and recycled to the process for the deposition of silicon carbide. As the solid deposit is separated, HCl and $CH_4$ are produced in the liquid state. The both are commercial products and are highly pure. The compressed hydrogen requires no fine cleaning either (as well as the original one) and can be directly used for the preparation of the original GVM by mixing it with MTCS. The recycle of hydrogen to the process exerts a substantial influence on such technical and economic indices as the amount of reactants used, and on the reduction in specific energy consumption, for neither hydrogen is to be cleaned nor electric energy spent to obtain hydrogen by electrolysis during the deposition of silicon carbide. 5 to 10% of the recycled electrolysis hydrogen are fed to the process. The process is illustrated by the following examples.

EXAMPLE 1

Methyl trichlorosilane (MTCS) cleaned by rectification and hydrogen )$H_2$) cleaned on a palladium filter were fed to a bubbler evaporator and mixed in a $H_2$ to MTCS molar ratio of 1–3:1. The resulting gas-vapor mixture (GVM) fed to the reactor in which a process of thermal decomposition was carried out on a heated graphite substrate to produce silicon carbide layers and gaseous decomposition products. The GVM feed density calculated for MTCS was maintained at 3–4 g/$cm^2$.hr and the substrate temperature was maintained at 1200°–1250° C. The process time was determined by the required thickness of the silicon carbide layer produced. The process deposition rate was 0.5–1 mm/hr. The decomposition products were withdrawn from the reaction zone. The resulting silicon carbide had the following characteristics: the porosity was less than 1%; the thermal expansion coefficient (200°–1000° C.) was 3.8–5.8 $10^{-6\circ}$ $C.^{-1}$, the specific heat capacity was 0.28 cal/mole °C. and the heat conductivity was 0.155 W/cm °C.

EXAMPLE 2

The process was carried out as in Example 1, and the decomposition products were condensed in series surface type heat exchangers operating at a temperature ranging from 0° C. to −120° C. The unreacted MTCS, $SiCl_4$, $SiHCl_3$, dimethyl dichlorosilane (DMDCS) became condensed at a condensation degree of 90 to 95%.

The residual amount of MTCS, $SiHCl_3$, $SiH_2Cl_2$ and DMDCS became completely condensed at a temperature ranging from −76° C. to −120° C.

Condensation is accompanied by freezing methane and hydrogen chloride at a temperature ranging from −121° C. to −196° C. The uncondensed hydrogen was compressed and was directed to be mixed with MTCS to the initial step of the process. The condensed liquid organochlorosilane and chlorosilanes at the first and second steps were admitted by gravity into a rectification column still for the separation operation. MTCS and DMCS separated in the course of rectification were directed to the initial step of the process to produce silicon carbide. Since the amount of the DMCS being recycled was substantially smaller than that of MTCS, the decomposition process parameters did not undergo any changes when other organochlorosilanes were added to the GVM. The rectified $SiCl_4$, $SiHCl_3$ and $SiH_2Cl$ are commercial products. The condensed and frozen HCl and $CH_4$ were kept warm and separated to obtain a commercial product.

The process results with the claimed parameter values are summarized in the table given below.

| Nos. | $H_2$:MTCS molar ratio | GVM feed density calculated for MTCS, m/$cm^2$ · hr | Substrate temperature, C. | Density, g/$cm^3$ | Porosity, % | TEC 200–100° C. deg $C.^{-1}$ | Specific heat capacity, cal/mol deg °C. | Heat conduction, W/cm · C. |
|---|---|---|---|---|---|---|---|---|
| 1 | 1:1 | 3 | 1200 | 3.21 | less than 1 | 3.8 $10^{-6}$ | 0.28 | 0.155 |
| 2 | 1:2 | 4 | 1250 | " | " | 4.5 · $10^{-6}$ | " | " |
| 3 | 1:3 | 4 | 1230 | " | " | 5.8 · $10^{-6}$ | " | " |

With a GVM feed density in the reactor of less than 3 g/$cm^2$.hr, the silicon carbide decomposition rate is reduced and the specific energy capacity of the process is increased, respectively, the silicon carbide deposit becomes more porous.

With a GVM feed density of greater than 4 g/cm$^2$.hr, the deposition rate is not increased, but greater amounts are used for the condensation of the unreacted methyl trichlorosilane.

A H$_2$:MTCS molar ratio of greater than 3 causes increased specific consumption of hydrogen per unit of the resulting product as well as improved porosity of silicon carbide.

A MTCS: H$_2$ molar ratio of less than 1:1 causes a smaller recovery of MTCS into the final product and also to the increased formulation of more reaction by-products.

The substrate temperature of lower than 1200° C. causes the disturbance of the stoicheometric composition of the deposit and the formation of a second phase.

The substrate temperature of higher than 1250° C. causes higher specific energy capacity of the process and the presence of druses on the surface of the deposit thus deteriorating the quality of the resulting product.

The temperature range of condensation of the effluent GVC from −70° C. to −75° C. determines the degree of condensation of about 95% of organochlorosilanes and chlorosilanes. The shift from the claimed range towards higher temperature causes irrevocable organochlorosilane losses.

The condensation at a temperature of up to −120° C. affords practically 100% recovery of organochlorosilanes and chlorosilanes.

The cooling of the gas phases at a temperature ranging from −185° C. to −196° C. affords the residual content of hydrogen chloride and methane in the hydrogen being recycled is <1.10$^{-2}$% by volume and <1.10$^{-1}$ by volume, respectively.

Proposed is an article produced by deposition of silicon carbide by process described above, said article contains in series at least a layer of elastic carbon material or silicon carbide as the carcass, a first silicon carbide layer having a thickness of 100 to 500 µm which forms a rigid fiber carcass on the mandrel, and also a second silicon carbide layer of the desired thickness on the carcass.

In a process for producing articles from silicon carbide layers by deposition from a gas phase, comprising feeding a gas-vapor mixture of methyl trichlorosilane and hydrogen into a reactor in a 1:(1.3) molar ratio, respectively, silicon carbide is deposited to a mandrel heated to 1200°–1250° C. and the mandrel is removed, according to the invention the gas-vapor mixture is fed at a density of 3–4 g/cm$^2$.hr; the deposition process is carried out by recycling methyl trichlorosilane and hydrogen, the recycling is effected by separating the effluent gas-vapor mixture products by low-temperature condensation and recovery of methyl trichlorosilane from the resulting liquid phase, and hydrogen from the gas phase; in order to produce articles free from internal mechanical stresses and with improved purity and to use wasteless technology, after removal of the mandrel, silicon carbide is ground and pressed, the mandrel is molded and the joint process is repeated under the conditions described above; the internal mechanical stresses are also reduced in the articles in that prior to deposition of silicon carbide, the mandrel is covered with an elastic fiber layer, silicon carbide with a thickness of 100:150 µm is deposited onto the layer to obtain a rigid fiber carcass on the mandrel, the mandrel is removed and silicon carbide is deposited on the carcass under the conditions described above.

The deposition process of silicon carbide is carried out by using the claimed combination of techniques such as the use of methyl trichlorosilane, high GVM feed density at low methyl trichlorosilane to hydrogen molar ratio. This process assures the stoichiometric composition of the article material, high density (the density value is theoretical) and compresses no second phases.

In addition to said characteristics, the resulting articles have lower values of internal mechanical stresses. This is a very important factor of quality since it increases the yield of the final product. This can be achieved by deposition either on a carcass of elastic carbon fibers reinforced with silicon carbide or on a mandrel formed or ground silicon carbide produced by the claimed techniques.

The article is illustrated by the following examples.

EXAMPLE 1

In order to produce a pipe from silicon carbide, the mandrel is a cylinder composed of carbon material such as graphite or salicylated graphite. The deposition process is carried out by feeding into a reactor a gas-vapor mixture comprising precleaned methyl trichlorosilane and hydrogen in a molar ratio of 1:1–3, respectively, at a feed density of 3–4 g/cm$^2$.hr onto a mandrel heated to a temperature ranging from 1200° to 1250° C. The deposition rate is 1 mm/hr.

After the desired thickness of 2 mm is attained, the deposition process is discontinued, the article is cooled and the mandrel is removed. The mandrel is removed either by burning graphite or by sandblast treatment. The internal surface is then subjected to chemical etching, washed and dried. The characteristics of the resulting papers are presented in the table.

EXAMPLE 2

In order to produce a pipe from silicon carbide, carbon fibers such as fabric, filaments and soft felt are applied to a mandrel composed of carbon material, a thickness of 100 to 500 µm of silicon carbide is deposited in the same manner as in Example 1 to reinforce the fibers and to obtain a rigid carcass. The mandrel is removed and SiO is deposited on the carcass which performs the functions of mandrel.

After the desired thickness of silicon carbide is attained, the article is cooled, the internal surface of the pipe is subjected to chemical etching and the mandrel is removed. The resulting pipe is free from any internal mechanical stresses.

EXAMPLE 3

In order to produce a pipe from silicon carbide, the mandrel is a cylinder composed of carbon material, e.g. graphite, and the process of silicon carbide deposition is carried out in the similar manner as in Example 1. After deposition of a 2 mm thick silicon carbide layer, the mandrel is removed. The silicon carbide pipe thus formed is ground to a size of 10 to 100 µm. The resulting powder is mixed with a binder, e.g. bakelite, pressed in a mold corresponding to the shape of the article obtained, the mandrel is molded at a temperature of 2600° C. and the deposition process is repeated as in Example 1. After the desired thickness is attained, the article is cooled. A mandrel can also be produced without using a binder.

Substandard (cracked) articles can be used as the starting material for the manufacture of a mandrel from silicon carbide. At a PGM feed density of less than 3 g/cm$^2$ in the reactor, the silicon carbide deposition rate becomes lower, the specific energy capacity of the process increases accordingly and the silicon carbide deposit becomes more porous.

At a PGM feed density of greater than 4 g/cm$^2$.hr in the reactor the silicon carbide deposition rate does not become higher and larger amounts of reactants have to be used for the condensation of the unreacted methyl trichlorosilane.

A $H_2$ to MTCS molar ratio of less than 1 causes a smaller recovery of MTCS into the final product and also the formation of more reaction by-products.

The substrate temperature of lower than 1200° C. causes the disturbance of the stoichemetric composition of the deposit and the formation of a second phase.

The substrate temperature of higher than 1250° C. increases the specific energy capacity of the process and causes the presence of druses on the deposit surface, thus making the resulting product inferior.

The claimed process is ecologically pure with the lower specific energy capacity and the smaller amount of reactants due to the recirculating effluent PGM containing the unreacted methyl trichlorosiloxane and hydrogen. In addition, the hydrogen recycled to the process requires no cleaning, and as the recirculation is effected, not more than 5 to 10% of hydrogen are fed to the silicon carbide deposition process. This substantially reduces the specific electric energy consumption since initial hydrogen is produced by electrosysis.

The resulting articles have much better quality as compared with the prior art articles (such as the stoichiometric composition, fine-grain structure, density) and exhibit greater strength due to the lack of mechanical stresses therein.

We claim:

1. A process for producing silicon carbide layers by deposition from a gas phase, comprising feeding a gas-vapor mixture of methyl trichlorosilane and hydrogen into a reactor and decomposing the mixture on a heated substrate to form a silicon carbide layer on said substrate and decomposition products, according to which process:

the gas-vapor mixture is fed to the reactor at a rate of 3–4 g/cm².hr and a methyl trichlorosilane to hydrogen molar ratio of 1:1–3 to said substrate heated to a temperature of from 1200° to 1250° C., the decomposition products from the gas-vapor mixture are withdrawn from the reactor, separated into a gas phase containing hydrogen chloride, methane, and hydrogen and a liquid phase by condensation at a temperature of from 0° to –120° C., the liquid phase is rectified, methyl trichlorosilane and dimethyldicholosilane resulting from the rectification are recovered and recycled to the reactor, the gas phase is cooled to a temperature of from –185° to –196° C. and the hydrogen chloride and the methane are recovered as a solid deposit, and the hydrogen is compressed and recycled to the reactor.

2. The process according to claim 1 wherein the condensation of the liquid phase is carried out in a stepwise manner at a temperature of from 0° to –120° C.

3. The process according to claim 2 wherein the substrate is a mandrel which is covered with a fiber layer, said silicon carbide layer is deposited on said mandrel covered with said fiber layer to a thickness of 100 to 500 microns to produce a rigid carcass composed of said fiber layer and said silicon carbide layer deposited on said fiber layer on said mandrel, the mandrel is separated from said rigid carcass and an additional layer of silicon carbide is deposited on said rigid carcass separated from said mandrel using the process of claim 2.

4. The process according to claim 2 wherein the substrate is a mandrel composed of silicon carbide previously produced by the process of claim 2.

5. The process according to claim 1 wherein the substrate is a mandrel which is covered with a fiber layer, said silicon carbide layer is deposited on said mandrel covered with said fiber layer to a thickness of 100 to 500 microns to produce a rigid carcass composed of said fiber layer and said silicon carbide layer deposited on said fiber layer on said mandrel, the mandrel is separated from said rigid carcass and an additional layer of silicon carbide is deposited on said rigid carcass separated from said mandrel using the process of claim 1.

6. The process according to claim 1 wherein the substrate is a mandrel composed of silicon carbide previously produced by the process of claim 1.

* * * * *